United States Patent
La et al.

(10) Patent No.: US 11,144,149 B2
(45) Date of Patent: Oct. 12, 2021

(54) METHODS AND TECHNIQUES FOR CORRECTING PRESSURE SENSOR DATA IN THE PRESENCE OF ABNORMAL PRESSURE SENSOR READINGS

(71) Applicant: STMicroelectronics Asia Pacific Pte Ltd, Singapore (SG)

(72) Inventors: Cam Chung La, Singapore (SG); Kien Beng Tan, Singapore (SG)

(73) Assignee: STMicroelectronics Asia Pacific Pte Ltd, Singapore (SG)

( * ) Notice: Subject to any disclaimer, the term of this patent is extended or adjusted under 35 U.S.C. 154(b) by 0 days.

(21) Appl. No.: 16/902,938

(22) Filed: Jun. 16, 2020

(65) Prior Publication Data

US 2020/0310583 A1 Oct. 1, 2020

Related U.S. Application Data

(63) Continuation of application No. 16/220,500, filed on Dec. 14, 2018, now Pat. No. 10,725,574.

(60) Provisional application No. 62/612,790, filed on Jan. 2, 2018.

(51) Int. Cl.
  *G06F 3/041* (2006.01)
  *H03K 17/96* (2006.01)

(52) U.S. Cl.
  CPC .......... *G06F 3/0414* (2013.01); *G06F 3/0418* (2013.01); *H03K 17/96* (2013.01); *H03K 17/9622* (2013.01); *H03K 2017/9615* (2013.01); *H03K 2217/94026* (2013.01)

(58) Field of Classification Search
  CPC ..... G06F 3/0414; G06F 3/0418; H03K 17/96; H03K 17/9622; H03K 2017/9615; H03K 2217/94026
  See application file for complete search history.

(56) References Cited

U.S. PATENT DOCUMENTS

| | | |
|---|---|---|
| 2008/0068343 A1 | 3/2008 | Hoshino et al. |
| 2011/0095919 A1 | 4/2011 | Ostermoller et al. |
| 2012/0032907 A1 | 2/2012 | Koizumi et al. |
| 2014/0043289 A1 | 2/2014 | Stern |
| 2015/0220198 A1 | 8/2015 | Yoo et al. |
| 2019/0018050 A1* | 1/2019 | Wang ..................... G01R 31/52 |

* cited by examiner

*Primary Examiner* — Dmitriy Bolotin
(74) *Attorney, Agent, or Firm* — Crowe & Dunlevy

(57) ABSTRACT

A determination is made as to whether touch pressure data acquired from each of a plurality of touch pressure sensors is indicative of abnormal operation. If abnormal operation is indicated, the touch pressure data from each of the plurality of touch pressure sensors, except those touch pressure sensors having touch pressure data indicative of abnormal operation, is summed. Then, the sum is multiplied by a correction factor to produce a touch pressure output indicative of physical force applied to the plurality of touch pressure sensors.

15 Claims, 4 Drawing Sheets

| | F@1 | F@2 | F@3 | F@4 | F@5 | F@6 | F@7 | F@8 | F@9 | F@10 | F@11 | F@12 | F@13 | F@14 | F@15 |
|---|---|---|---|---|---|---|---|---|---|---|---|---|---|---|---|
| S0 | 1443 | 3528 | 4404 | 3357 | 1642 | 3601 | 8942 | 12894 | 8564 | 3577 | 1804 | 5083 | 7658 | 5180 | 1850 |
| S1 | 1299 | 3113 | 3904 | 3038 | 1520 | 3191 | 7623 | 11071 | 7489 | 3253 | 1592 | 4516 | 6816 | 4628 | 1704 |
| Variation(%)= (S1-S0)/S0 | -9.9% | -11.8% | -11.4% | -9.5% | -7.5% | -11.4% | -14.7% | -14.1% | -12.6% | -9.1% | -11.8% | -11.1% | -11.0% | -10.6% | -7.9% |

FIG. 5

METHODS AND TECHNIQUES FOR CORRECTING PRESSURE SENSOR DATA IN THE PRESENCE OF ABNORMAL PRESSURE SENSOR READINGS

RELATED APPLICATION

This application is a continuation of U.S. patent application Ser. No. 16/220,500, filed Dec. 14, 2018, which itself claims the benefit and priority of U.S. Provisional Patent Application No. 62/612,790, filed Jan. 2, 2018, the disclosures of both of which are incorporated by reference.

TECHNICAL FIELD

This disclosure is related to the field of sensing the pressure of touches to a touch sensitive display, and, more particularly, to ways of obtaining usable touch pressure data even when one or more touch pressure sensors in the touch sensitive display are functioning abnormally.

BACKGROUND

Touch screen displays are widely employed for display of data and receipt of user input in a variety of devices, such as smartphones, tablets, and smartwatches. Touch screen displays can determine the X and Y coordinates of a touch thereto, which can be used as user input. In addition, touch screen displays can determine not only the location of a touch, but also the duration of a touch, permitting a tap to be differentiated from a long press, which can be used as another form of user input.

Still further, some touch screen displays can also determine the pressure or force applied during a touch, allowing for an even further type of user input. However, in some cases, touch pressure sensors used to sense deformation of the touch screen display resulting from the pressure or force applied during a touch can become damaged or broken, and function abnormally.

In current devices, the presence of damaged or broken touch pressure sensors can render the determination of pressure or force applied during a touch to be inaccurate. This could result in improper functionality of an electronic device incorporating the touch screen display.

New developments in the area of pressure or force sensing are therefore needed.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

Disclosed herein is a method including acquiring touch pressure data from a plurality of touch pressure sensors, and for each of the plurality of touch pressure sensors, a determination is made as to whether the touch pressure data from that touch pressure sensor is indicative of abnormal operation of that touch pressure sensor. Where no abnormal operation is indicated, the touch pressure data from each of the plurality of touch pressure sensors is summed to produce a touch pressure output. Where abnormal operation is indicated, the touch pressure data from each of the plurality of touch pressure sensors is summed and multiplied the sum by a correction factor to produce the touch pressure output.

Determining whether the touch pressure data from a given touch pressure sensor is indicative of abnormal operation may be performed by determining whether the touch pressure data from the given touch pressure sensor exceeds an upper limit or is below a lower limit.

In a calibration mode: a) for each of the plurality of touch pressure sensors, a same force may be applied to that touch pressure sensor while acquiring touch pressure data from each of the plurality of touch pressure sensors, and the touch pressure data acquired from each of the plurality of touch pressure sensors may be summed to produce a reference touch pressure output for that touch pressure sensor; and b) a given one of the plurality of touch pressure sensors is designated as being an abnormally operating touch pressure sensor, and, for each of the plurality of touch pressure sensors except the designated given one of the plurality of touch pressure sensors, a same force is applied to that touch pressure sensor while acquiring touch pressure data for each of the plurality of touch pressure sensors except the designated given one to produce an abnormal reference touch pressure output for the designated given one of the plurality of touch pressure sensors.

In the calibration mode a variation may be determined between normal and abnormal operation for each of the plurality of touch pressure sensors by determining a variation between each reference touch pressure output and its corresponding abnormal touch pressure output, and the correction factor may be generated as a function of the variation between each reference touch pressure output and its corresponding abnormal touch pressure output.

In the calibration mode: c) iteratively repetitions of b) may be performed for each of the plurality of touch pressure sensors, with a different given one of the plurality of touch pressure sensors being the designated given one for each iteration, and d) for each iteration of c) a variation may be determined between each reference touch pressure output and its corresponding abnormal touch pressure output.

In the calibration mode, for each iteration of c), a correction factor may be generated for the given one of the plurality of touch pressure sensors being the designated given one, as a function of the variation between each reference touch pressure output and its corresponding abnormal touch pressure output.

Where abnormal operation is indicated, the multiplication of the sum by the correction factor may include multiplication of the sum by the correction factor corresponding to which of the plurality of touch pressure sensors is operating normally.

In the calibration mode, for each iteration of (c), a plurality of different correction factors may be generated for the given one of the plurality of touch pressure sensors being the designated given one, as a function of the variation between each reference touch pressure output and its corresponding abnormal touch pressure output, with each of the plurality of different correction factors corresponding to a different touch zone.

Where abnormal operation is indicated, the summing of the touch pressure data from each of the plurality of touch pressure sensors may be performed by, for each of the different touch zones, summing the touch pressure data from each of the plurality of touch pressure sensors associated with that zone to produce a zone sum. The multiplication may be performed by multiplying each zone sum by a corresponding correction factor for that zone, and the touch pressure output may be produced by summing each zone sum after multiplication by its corresponding correction factor.

A device aspect is disclosed herein. The device includes a touch and pressure sensitive screen with a plurality of touch pressure sensors, and a touch and pressure sensitive screen controller. This controller is configured to acquire touch pressure data from the plurality of touch pressure sensors, and for each of the plurality of touch pressure sensors, determine whether the touch pressure data from that touch pressure sensor is indicative of abnormal operation of that touch pressure sensor. Where no abnormal operation is indicated, the controller sums the touch pressure data from each of the plurality of touch pressure sensors to produce a touch pressure output. Where abnormal operation is indicated, the controller sums the touch pressure data from each of the plurality of touch pressure sensors and multiplies the sum by a correction factor to produce the touch pressure output.

The touch and pressure sensitive screen controller may be configured to, in a calibration mode: a) for each of the plurality of touch pressure sensors, apply a same force to that touch pressure sensor while acquiring touch pressure data from each of the plurality of touch pressure sensors, and sum the touch pressure data acquired from each of the plurality of touch pressure sensors to produce a reference touch pressure output for that touch pressure sensor; and b) designate a given one of the plurality of touch pressure sensors as being an abnormally operating touch pressure sensor, and, for each of the plurality of touch pressure sensors except the designated given one of the plurality of touch pressure sensors, apply a same force to that touch pressure sensor while acquiring touch pressure data for each of the plurality of touch pressure sensors except the designated given one to produce an abnormal reference touch pressure output for the designated given one of the plurality of touch pressure sensors.

The touch and pressure sensitive screen controller may also be configured to, in the calibration mode, determine a variation between normal and abnormal operation for each of the plurality of touch pressure sensors by determining a variation between each reference touch pressure output and its corresponding abnormal touch pressure output, and generate the correction factor as a function of the variation between each reference touch pressure output and its corresponding abnormal touch pressure output.

The touch and pressure sensitive screen controller may be configured to, in the calibration mode: iteratively repeat b) for each of the plurality of touch pressure sensors, with a different given one of the plurality of touch pressure sensors being the designated given one for each iteration; and for each iteration of c) determine a variation between each reference touch pressure output and its corresponding abnormal touch pressure output.

The touch and pressure sensitive screen controller may also be configured to, in the calibration mode: for each iteration of c), generate a correction factor for the given one of the plurality of touch pressure sensors being the designated given one, as a function of the variation between each reference touch pressure output and its corresponding abnormal touch pressure output.

Where abnormal operation is indicated, the multiplication of the sum by the correction factor may be performed by multiplying the sum by the correction factor corresponding to which of the plurality of touch pressure sensors is operating normally.

The touch and pressure sensitive screen controller may be configured to, in the calibration mode: for each iteration of (c), generate a plurality of different correction factors for the given one of the plurality of touch pressure sensors being the designated given one, as a function of the variation between each reference touch pressure output and its corresponding abnormal touch pressure output, with each of the plurality of different correction factors corresponding to a different touch zone.

Where abnormal operation is indicated, the summing of the touch pressure data from each of the plurality of touch pressure sensors may be performed by, for each of the different touch zones, summing the touch pressure data from each of the plurality of touch pressure sensors associated with that zone to produce a zone sum, and the multiplication may be performed by multiplying each zone sum by a corresponding correction factor for that zone. The touch pressure output may be produced here by summing each zone sum after multiplication by its corresponding correction factor.

Disclosed herein is a method including determining whether touch pressure data acquired from each of a plurality of touch pressure sensors is indicative of abnormal operation. If abnormal operation is indicated, the method includes summing the touch pressure data from each of the plurality of touch pressure sensors except those touch pressure sensors having touch pressure data indicative of abnormal operation, and multiplying the sum by a correction factor to produce a touch pressure output indicative of physical force applied to the plurality of touch pressure sensors.

The correction factor may not be dependent upon which touch pressure sensors have touch pressure data indicative of abnormal operation.

One of the plurality of touch pressure sensors may have touch pressure data indicative of abnormal operation. The plurality of touch pressure sensors may be arranged into a plurality of different touch pressure sensing zones, with each touch pressure sensing zone containing at least two of the plurality of touch pressure sensors. The correction factor may be dependent upon which touch pressure sensing zone contains the touch pressure sensor having the touch pressure data indicative of abnormal operation.

At least two of the plurality of touch pressure sensors may have touch pressure data indicative of abnormal operation. The plurality of touch pressure sensors may be arranged into a plurality of different touch pressure sensing zones, with each touch pressure sensing zone containing at least two of the plurality of touch pressure sensors. For each of the at least two of the plurality of touch pressure sensors having the touch pressure data indicative of abnormal operation, a correction factor for the touch pressure sensing zone including that touch pressure sensor may be determined, and a touch pressure sum for the touch pressure sensing zone including that touch pressure sensor may be calculated and multiplied by the correction factor for that touch pressure sensing zone to produce a corrected touch pressure sum for that touch pressure sensing zone, wherein the touch pressure data for that touch pressure sensor indicative of abnormal operation is not included in the touch pressure sum for the touch pressure sensing zone including that touch pressure sensor. A touch pressure sum for each touch pressure sensing zone not including touch pressure sensors having touch pressure data indicative of abnormal operation may be calculated. The touch pressure sum for each touch pressure sensing zone not including at least one touch pressure sensor having touch pressure data indicative of abnormal operation may be summed with the corrected touch pressure sum for each touch pressure sensing zone including at least one touch pressure sensor having touch pressure indicative of abnormal operation.

Determining whether the touch pressure data from a given touch pressure sensor is indicative of abnormal operation may include comparing the touch pressure data from the given touch pressure sensor to a limit, and determining that the touch pressure data from that touch pressure sensor is abnormal based upon the comparison.

The limit may be an upper limit and the touch pressure data for that touch pressure sensor may be determined to be abnormal if the touch pressure data for that touch pressure sensor is greater than the upper limit.

The limit may be a lower limit and the touch pressure data for that touch pressure sensor may be determined to be abnormal if the touch pressure data for that touch pressure sensor is less than the lower limit.

In a calibration mode: a) for each of the plurality of touch pressure sensors, a reference touch pressure output for that touch pressure sensor may be produced; and b) a given one of the plurality of touch pressure sensors may be designated as being an abnormally operating touch pressure sensor, and, for each of the plurality of touch pressure sensors except the designated given one of the plurality of touch pressure sensors, a same force may be applied to that touch pressure sensor while acquiring touch pressure data for each of the plurality of touch pressure sensors except the designated given one to produce an abnormal reference touch pressure output for the designated given one of the plurality of touch pressure sensors.

In the calibration mode, the correction factor may be generated based upon a comparison between each reference touch pressure output and its corresponding abnormal touch pressure output.

Also disclosed herein is a method including for each of a plurality of touch pressure sensors, applying a same given force to that touch pressure sensor while acquiring touch pressure data from each of the plurality of touch pressure sensors to produce a reference sum for that touch pressure sensor. The method also includes for each of the plurality of touch pressure sensors, determining an abnormal operation sum for that touch pressure sensor by applying the same given force to that touch pressure sensor while acquiring touch pressure data from each of the plurality of touch pressure sensors but discarding the acquired touch pressure data for that touch pressure sensor. The method further includes calculating a variance for each touch pressure sensor based upon the reference sum and the abnormal operation sum for that touch pressure sensor, and calculating a correction factor for each touch pressure sensor based on its variance.

The method may also include summing acquired touch pressure data from each of the plurality of touch pressure sensors except the acquired touch pressure data from a touch pressure sensor having touch pressure data indicative of abnormal operation, and multiplying the sum by the correction factor for the touch pressure sensing having the touch pressure data indicative of abnormal operation to produce corrected touch pressure data.

Also disclosed herein is an apparatus including a controller for a touch and pressure sensitive screen including a plurality of touch pressure sensors, wherein the plurality of touch pressure sensors are arranged into a plurality of different touch sensing zones. The controller is configured to acquire touch pressure data from the plurality of touch pressure sensors and generate a zone sum for each of the plurality of different touch sensing zones. The zone sum for each of the plurality of different touch sensing zones may be generated by summing the touch pressure data from each of the plurality of touch pressure sensors within that touch sensing zone, if that touch sensing zone does not contain a touch pressure sensor having touch pressure data indicative of abnormal operation, to produce at least one zone sum, and summing the touch pressure data from each of the plurality of touch pressure sensors within that touch sensing zone except for the touch pressure data from a touch pressure sensor within that touch sensing zone indicative of abnormal operation to produce a zone sum to be corrected, and multiplying the zone sum to be corrected by a corresponding correction factor for that zone to produce at least one corrected zone sum. A touch pressure output may be produced by summing the at least one zone sum and the at least one corrected zone sum.

A touch and pressure sensing display may include the plurality of touch pressure sensors, and may include a plurality of touch location sensors separate from the plurality of touch pressure sensors.

Each touch pressure sensor may have touch pressure data indicative of abnormal operation is broken.

The plurality of touch pressure sensors are not touch location sensors.

BRIEF DESCRIPTION OF THE DRAWINGS

FIG. 5 is a chart showing determined touch pressure readings during the configuration method of FIG. 4.

DETAILED DESCRIPTION

Figure 1:
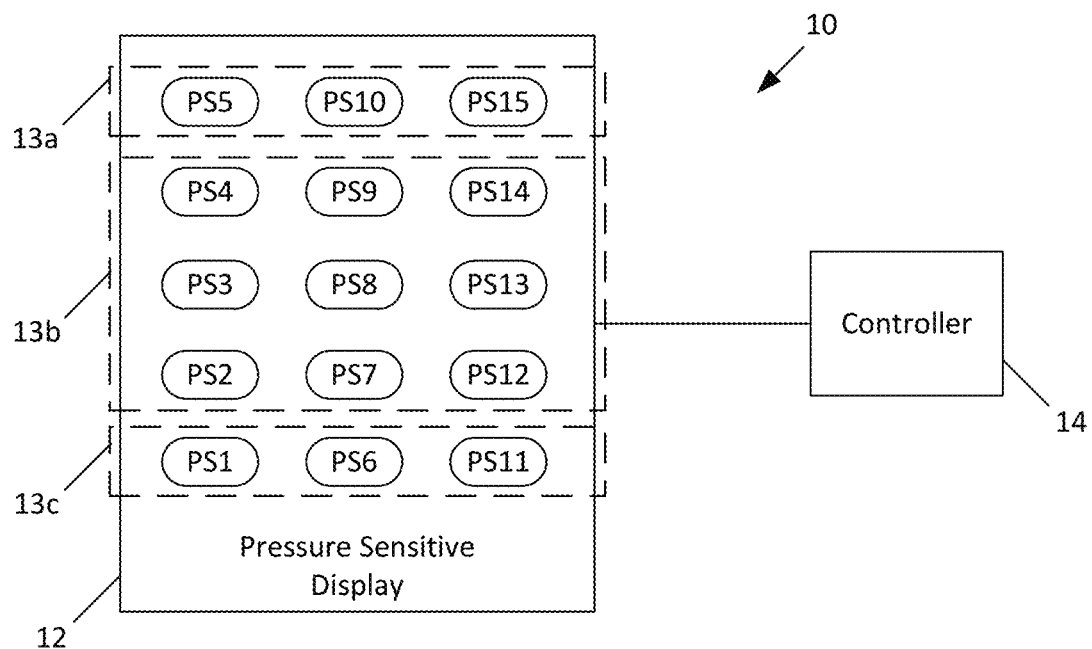
FIG. 1 is a block diagram of an electronic device including a touch and pressure sensing display, in accordance with this disclosure.

One or more embodiments of the present disclosure will be described below. These described embodiments are only examples of the presently disclosed techniques. Additionally, in an effort to provide a concise description, all features of an actual implementation may not be described in the specification.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Like reference numbers in the drawing figures refer to like elements throughout.

Figure 2:
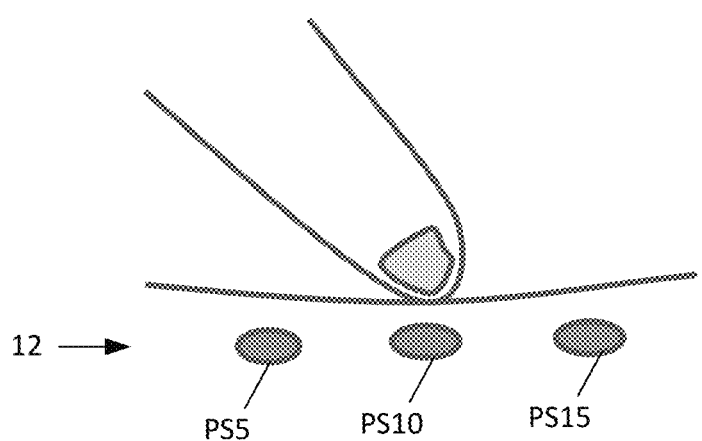
FIG. 2 is a depiction of a finger applying force to a touch and pressure sensing display and the resulting deformation of the display.

With initial reference to FIG. 1, an electronic device 10 including a touch and pressure sensing display 12 is now described. The touch and pressure sensing display 12 includes touch pressure sensors PS1-PS15. It will be noted that the sensors PS1-PS15 may be separate from any included touch location sensors. When sufficient force is applied by a finger to the touch and pressure sensing display 12, the display will deform, as shown in FIG. 2. The touch pressure sensors PS1-PS15 serve to transform this deformation into an electrical signal that is read by a controller 14 and used to determine the pressure applied by the finger to the touch and pressure sensing display 12.

In some instances, one or more of the touch pressure sensors PS1-PS15 may function abnormally, such as after becoming damaged. In these instances, the abnormally functioning touch pressure sensor or sensors PS1-PS15 may return incorrect touch pressure data, which can lead the controller 14 to provide incorrect data to other parts of the electronic device 10.

As can be seen, the touch pressure sensor PS1-PS15 can be separated into different pressure sensing zones 13a, 13b, 13c. These zones 13a, 13b, 13c are determined as groups of touch pressure sensors capable of influencing each other significantly if functioning abnormally. For example, for the arrangement of touch pressure sensors PS1-PS15 shown, pressure sensing zone 13a includes touch pressure sensors PS5, PS10, and PS15.

When any sensor in a zone is broken, the force applied to any place within this zone will have its output reading altered significantly because its output reading is equal to the sum of data from all sensors. Locations outside the zone may not see a significant change in results when a sensor within the zone is broken. Since any arrangement of touch pressure sensors may be used, it should be appreciated that the pressure sensing zones may be drawn in any suitable way, and that the techniques shown herein are not limited to the setup shown in FIG. 1.

So as to permit touch and pressure sensing displays 12 with one or more abnormally functioning touch pressure sensors PS1-PS15 to still perform pressure sensing with satisfactory results, a touch pressure correction technique may be performed.

Figure 3:
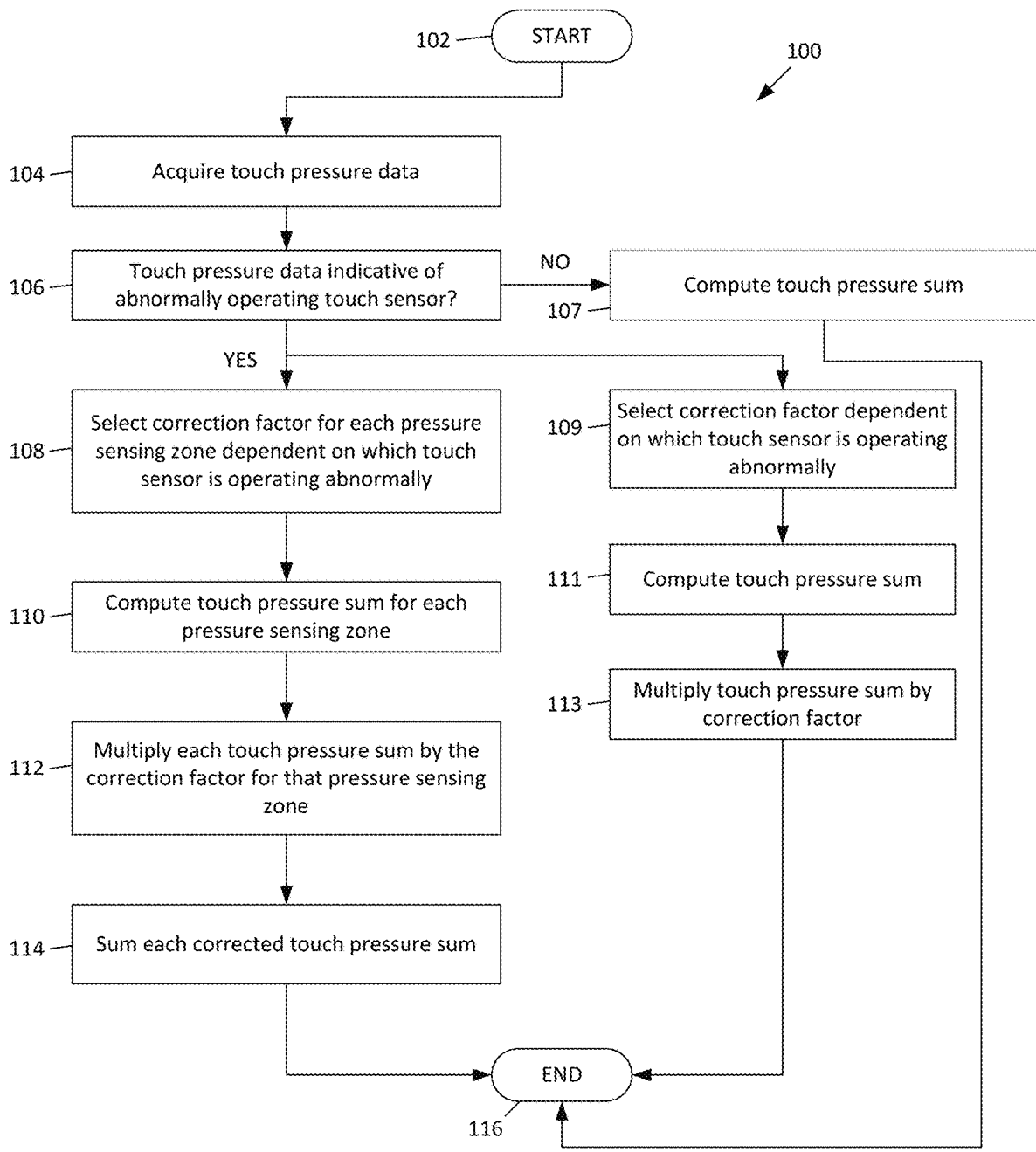
FIG. 3 is a flowchart of a touch pressure sensing method capable of returning accurate results in the presence of one or more abnormally operating touch pressure sensors, in accordance with this disclosure.

Such a touch pressure correction technique is now described with additional reference to flowchart 100 of FIG. 3. After the start (Block 102), the controller 14 acquires touch pressure data from the touch pressure sensors PS1-PS15 (at Block 104). This touch pressure data is then checked to see whether it is indicative of one or more abnormally functioning touch pressure sensors PS1-PS15 (at Block 106) using the controller 14. This check is performed by determining whether the touch pressure data collected from any individual touch pressure sensor PS1-PS15 is either above an upper threshold value or below a lower threshold value. If the touch pressure data from any individual touch pressure sensor PS1-PS15 is above the upper threshold or below the lower threshold, then that touch pressure sensor is considered to be functioning abnormally.

If the touch pressure data is not indicative of any abnormally operating touch pressure sensors PS1-PS15 at Block 106, then a sum of the touch pressure data from the touch pressure sensors PS1-PS15 is determined (at Block 107) by the controller 14 for use by other components of the electronic device 10, ending an iteration of the touch pressure correction technique (Block 116).

If the touch pressure data is indicative of an abnormally operating touch pressure sensor PS1-PS15, then one of two correction variants can be applied by the controller 14. A simpler correction variant includes selecting a correction factor dependent on which touch sensor is found to be operating abnormally (Block 109), summing the acquired touch pressure data while leaving out the item of data from the touch pressure sensor found to be operating abnormally (Block 111), and then multiplying the sum by the selected correction factor (Block 113). Thus, the corrected sum according to the simpler correction variant is calculated as:

$$S = \alpha \Sigma sensor_i,$$

where i includes all sensors except those found to be operating abnormally, $sensor_i$ is the pressure data, and $\alpha$ is the correction factor.

For more accurate results, the more involved correction variant can be performed. Here, a different correction factor is selected for each pressure sensing zone 13a, 13b, 13c, dependent on which touch pressure sensor PS1-PS15 is operating abnormally (at Block 108). A touch pressure sum is then computed for each pressure sensing zone 13a, 13b, 13c (at Block 110), and each touch pressure sum is multiplied by the correction factor for that pressure sensing zone (at Block 112). Thus, the corrected sum according to the more involved correction variation variant is calculated, and each corrected touch pressure sum is summed. This is calculated as:

$$S = X\Sigma sensor_i + Y\Sigma sensor_j + Z\Sigma sensor_k,$$

where i includes the touch pressure sensors PS1, PS6, PS11 in zone 13c, j includes the touch pressure sensors PS2-PS4, PS7-PS9, PS12-PS14 in zone 13b, and k includes the touch pressure sensors PS5, P10, PS15 in zone 13a, X is the correction factor for zone 13c, Y is the correction factor for zone 13b, Z is the correction factor for zone 13a, and sensor is the pressure data. Note that data from touch pressure sensors considered to be operating abnormally is not included in this calculation.

This ends an iteration of this touch pressure correction technique (Block 116).

Figure 4:
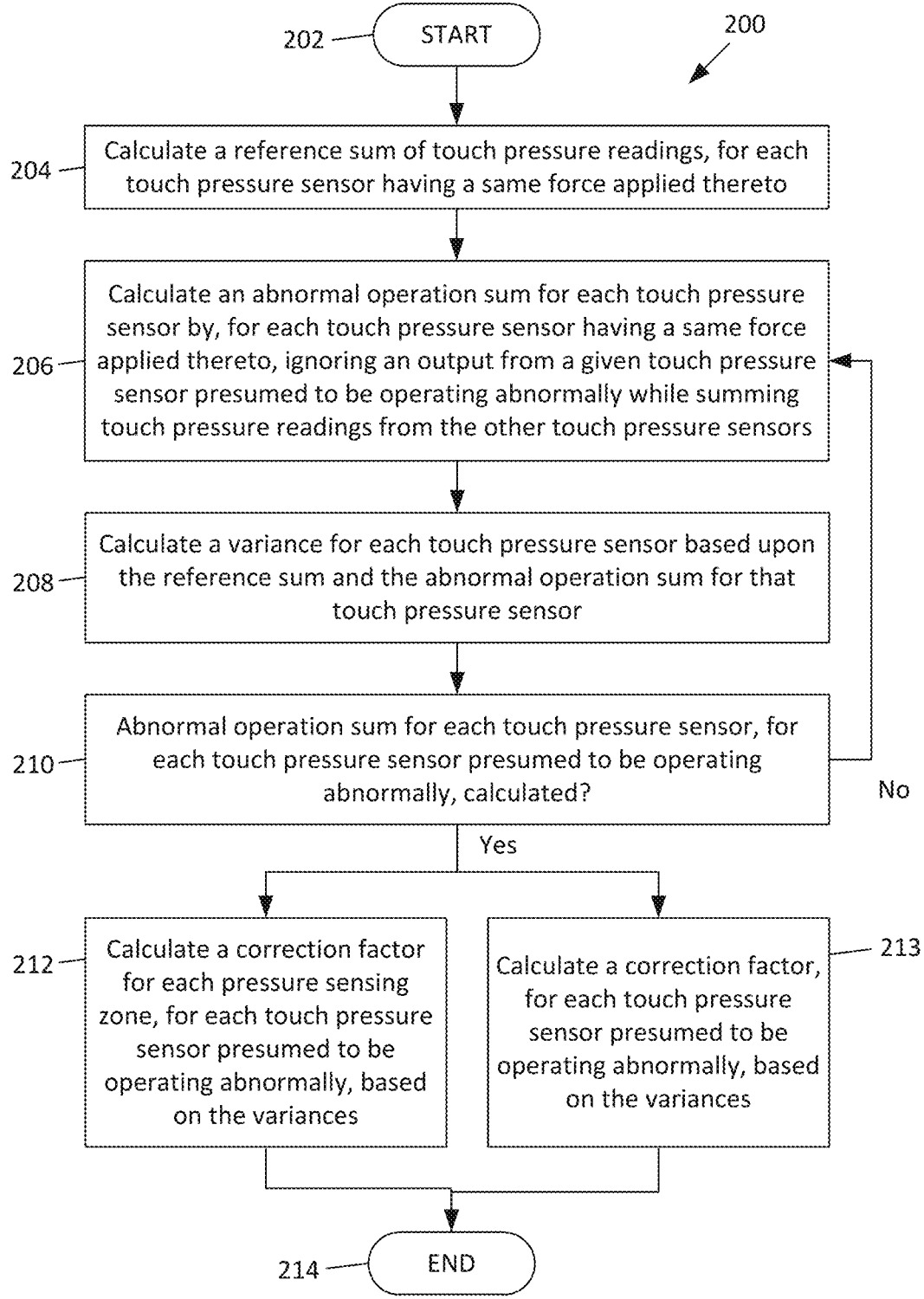
FIG. 4 is a flowchart of a configuration method used to determine the correction factors of FIG. 3.

Determination of the correction factors in a calibration operation is now described with additional reference to the flowchart 200 of FIG. 4. After the start (Block 202), a reference sum of touch pressure readings is determined for each touch pressure sensor PS1-PS15 while having a same force applied thereto (Block 204). In greater detail, a given force is applied to touch pressure sensor PS1, and touch pressure data is acquired from each touch pressure sensor PS1-PS15 and summed. The result is the reference sum for touch pressure sensor PS1. Next, the same given force is applied to touch pressure sensor PS2, and touch pressure data is acquired from each touch pressure sensor PS1-PS15 and summed. The result is the reference sum for touch pressure sensor S2. As stated, this is performed for each touch pressure sensor PS1-PS15.

Next, an abnormal operation sum is determined for each touch pressure sensor PS1-PS15 while having the same given force applied thereto, for a given touch pressure sensor assumed to be operating abnormally (Block 206). In greater detail, to determine the abnormal operation sum at the touch pressure sensor PS1, assuming the touch pressure sensor PS1 is operating abnormally, the same given force is applied to the touch pressure sensor PS1, and data is acquired from touch pressure sensors PS2-PS15 (or acquired from touch pressure sensors PS1-PS15, and then the data from touch pressure sensor PS1 is discarded). The touch pressure data from touch pressure sensors PS2-PS15 is summed, and this sum is the abnormal operation sum for touch pressure sensor PS1, assuming that touch pressure sensor PS1 is the touch pressure sensor operating abnormally. To determine the abnormal operation sum at the touch pressure sensor PS2, assuming the touch pressure sensor PS2 is operating abnormally, the same given force is applied to the touch pressure sensor PS2, and data is acquired from touch pressure sensors PS1-PS15 (or acquired from touch pressure sensors PS1-PS15, and then the data from touch pressure sensor PS2 is not used). The touch pressure data from touch pressure sensors PS1-PS15 is summed, excluding the data from touch pressure sensor PS2, and this sum is the abnormal operation sum for touch pressure sensor PS2, assuming that touch pressure sensor PS1 is the pressure sensor operating abnormally. This is performed for each touch pressure sensor PS1-PS15 to obtain the abnormal operation sum for the given touch pressure sensor (PS1 in the example).

Then, a variance for each touch pressure sensor PS1-PS15 is determined based upon the reference sum and the abnormal operation sum, for that given touch pressure sensor assumed to be operating abnormally (Block 208). A chart showing sample reference sums, abnormal operation sums, and variances is shown in FIG. 5, for the example where PS8 is assumed to be not working.

This sequence is repeated for each touch pressure sensor PS1-PS15 having a turn as the given touch pressure sensor assumed to be operating abnormally (Block 210). For example, Block 206 and Block 208 are performed for the touch pressure sensor PS1 being the given touch pressure sensor assumed to be operating abnormally, then Block 206 and 208 are performed for the touch pressure sensor PS2 being the given touch pressure sensor assumed to be operating abnormally, etc.

Next, if the simpler correction variant is to be used, then a different correction factor is determined for each touch pressure sensor presumed to be operating abnormally (Block 213), based on the variances. For example, correction factor α may be determined for touch pressure sensor PS1 being the given touch pressure sensor assumed to be operating abnormally, correction factor α may be determined for touch pressure sensor PS2 being the given touch pressure sensor assumed to be operating abnormally, etc. This way, the controller 14 can apply the proper correction factor based upon which touch pressure sensor PS1-PS15 is found to be operating abnormally.

If the more involved correction variant is to be used, then a different correction factor for each pressure sensing zone 13*a*, 13*b*, 13*c* is determined based on the variances (Block 212), for each touch pressure sensor presumed to be operating abnormally. For example, correction factors X, Y, and Z may be determined for touch pressure sensor PS1 being the given touch pressure sensor assumed to be operating abnormally, correction factors X, Y, Z may be determined for touch pressure sensor PS2 being the given touch pressure sensor assumed to be operating abnormally, etc. This way, the controller 14 can apply the proper correction factors to the pressure sensing zones 13*a*, 13*b*, and 13*c* based upon which touch pressure sensor PS1-PS15 is found to be operating abnormally.

Block 214 signifies the completion of the process for determination of the correction factors.

It should be understood that while the above has been described with reference to correction for one touch pressure sensor PS1-PS15 operating abnormally, it may be applied to correct for any number of abnormally operating touch pressure sensors PS1-PS15, by determining the correction factors the same way as described above but assuming two or more of the pressure sensors PS1-PS15 to be operating abnormally. In such a case, for example, with two sensors operating abnormally, the summation would not include the pressure for these two sensors.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A method, comprising:
   determining whether touch pressure data acquired from any touch pressure sensor of a plurality of touch pressure sensors is indicative of abnormal operation; and
   if abnormal operation is indicated, summing the touch pressure data from each of the plurality of touch pressure sensors except those touch pressure sensors having touch pressure data indicative of abnormal operation, and multiplying the sum by a correction factor to produce a touch pressure output indicative of physical force applied to the plurality of touch pressure sensors.

2. The method of claim 1, wherein the correction factor is not dependent upon which touch pressure sensors have touch pressure data indicative of abnormal operation.

3. The method of claim 1,
   wherein one touch pressure sensor of the plurality of touch pressure sensors has touch pressure data indicative of abnormal operation;
   wherein the plurality of touch pressure sensors are arranged into a plurality of different touch pressure sensing zones, with each touch pressure sensing zone containing at least two touch pressure sensors of the plurality of touch pressure sensors; and
   wherein the correction factor is dependent upon which touch pressure sensing zone contains said one touch pressure sensor having the touch pressure data indicative of abnormal operation.

4. The method of claim 1,
   wherein at least two touch pressure sensors of the plurality of touch pressure sensors have touch pressure data indicative of abnormal operation;
   wherein the plurality of touch pressure sensors are arranged into a plurality of different touch pressure sensing zones, with each touch pressure sensing zone containing at least two touch pressure sensors of the plurality of touch pressure sensors;
   wherein, for each touch pressure sensor of said at least two touch pressure sensors of the plurality of touch pressure sensors having the touch pressure data indicative of abnormal operation:
   determining a correction factor for the touch pressure sensing zone including that touch pressure sensor;
   calculating a touch pressure sum for the touch pressure sensing zone including that touch pressure sensor and multiplying that touch pressure sum by the correction factor for that touch pressure sensing zone to produce a corrected touch pressure sum for that touch pressure sensing zone, wherein the touch pressure data for that touch pressure sensor indicative of abnormal operation is not included in the touch pressure sum for the touch pressure sensing zone including that touch pressure sensor;
   calculating a touch pressure sum for each touch pressure sensing zone not including touch pressure sensors having touch pressure data indicative of abnormal operation; and
   summing the touch pressure sum for each touch pressure sensing zone not including at least one touch pressure sensor having touch pressure data indicative of abnormal operation with the corrected touch pressure sum for each touch pressure sensing zone including at least one touch pressure sensor having touch pressure indicative of abnormal operation.

5. The method of claim 1, wherein determining whether the touch pressure data from a given touch pressure sensor is indicative of abnormal operation comprises comparing the touch pressure data from the given touch pressure sensor to a limit, and determining that the touch pressure data from that touch pressure sensor is abnormal based upon the comparison.

6. The method of claim 5, wherein the limit is an upper limit and the touch pressure data for that touch pressure sensor is determined to be abnormal if the touch pressure data for that touch pressure sensor is greater than the upper limit.

7. The method of claim 5, wherein the limit is a lower limit and the touch pressure data for that touch pressure sensor is determined to be abnormal if the touch pressure data for that touch pressure sensor is less than the lower limit.

8. The method of claim 1, further comprising, performing a calibration mode operation comprising:
   a) producing a reference touch pressure output for each touch pressure sensor of the plurality of touch pressure sensors; and
   b) designating a given one of the plurality of touch pressure sensors as being an abnormally operating touch pressure sensor, and, for each of the plurality of touch pressure sensors except the designated given one of the plurality of touch pressure sensors, applying a same force to that touch pressure sensor while acquiring touch pressure data for each of the plurality of touch pressure sensors except the designated given one to produce an abnormal reference touch pressure output for the designated given one of the plurality of touch pressure sensors.

9. The method of claim 8, further comprising, in the calibration mode:
generating the correction factor based upon a comparison between each reference touch pressure output and its corresponding abnormal touch pressure output.

10. A method, comprising:
for each touch pressure sensor of a plurality of touch pressure sensors, applying a same given force to that touch pressure sensor while acquiring touch pressure data from each of the plurality of touch pressure sensors to produce a reference sum for that touch pressure sensor;
for each touch pressure sensor of the plurality of touch pressure sensors, determining an abnormal operation sum for that touch pressure sensor by applying the same given force to that touch pressure sensor while acquiring touch pressure data from each of the plurality of touch pressure sensors but discarding the acquired touch pressure data for that touch pressure sensor;
calculating a variance for each touch pressure sensor based upon the reference sum and the abnormal operation sum for that touch pressure sensor; and
calculating a correction factor for each touch pressure sensor based on the calculated variance.

11. The method of claim 10, further comprising summing acquired touch pressure data from each of the plurality of touch pressure sensors except the acquired touch pressure data from a touch pressure sensor having touch pressure data indicative of abnormal operation, and multiplying the sum by the correction factor for the touch pressure sensing having the touch pressure data indicative of abnormal operation to produce corrected touch pressure data.

12. An apparatus, comprising:
a controller for a touch and pressure sensitive screen including a plurality of touch pressure sensors, wherein the plurality of touch pressure sensors are arranged into a plurality of different touch sensing zones;
wherein the controller is configured to:
   acquire touch pressure data from the plurality of touch pressure sensors;
   generate a zone sum for each of the plurality of different touch sensing zones by:
      summing the touch pressure data from each of the plurality of touch pressure sensors within that touch sensing zone, if that touch sensing zone does not contain a touch pressure sensor having touch pressure data indicative of abnormal operation, to produce at least one zone sum; and
      summing the touch pressure data from each of the plurality of touch pressure sensors within that touch sensing zone except for the touch pressure data from a touch pressure sensor within that touch sensing zone indicative of abnormal operation to produce a zone sum to be corrected, and multiplying the zone sum to be corrected by a corresponding correction factor for that zone to produce at least one corrected zone sum; and
   generate a touch pressure output by summing the at least one zone sum and the at least one corrected zone sum.

13. The apparatus of claim 12, further comprising a touch and pressure sensing display including the plurality of touch pressure sensors, and including a plurality of touch location sensors separate from the plurality of touch pressure sensors.

14. The apparatus of claim 12, wherein each touch pressure sensor having touch pressure data indicative of abnormal operation is broken.

15. The apparatus of claim 12, wherein the plurality of touch pressure sensors are not touch location sensors.

* * * * *